Figure 1:
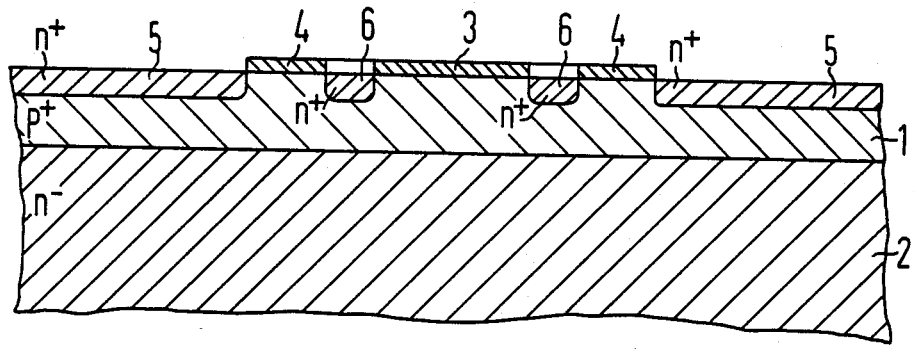

United States Patent [19]

Huber et al.

[11] Patent Number: 4,497,109
[45] Date of Patent: Feb. 5, 1985

[54] METHOD OF FABRICATING LIGHT-CONTROLLED THYRISTOR UTILIZING SELECTIVE ETCHING AND ION-IMPLANTATION

[75] Inventors: Peter Huber; Jens P. Stengl; Jenö Tihanyi, all of Munich, Fed. Rep. of Germany

[73] Assignee: Siemens Aktiengesellschaft, Berlin and Munich, Fed. Rep. of Germany

[21] Appl. No.: 587,839

[22] Filed: Mar. 12, 1984

Related U.S. Application Data

[62] Division of Ser. No. 212,505, Dec. 3, 1980, abandoned.

[30] Foreign Application Priority Data

Dec. 21, 1979 [DE] Fed. Rep. of Germany ....... 2951916

[51] Int. Cl.³ .................... H01L 21/302; H01L 21/38
[52] U.S. Cl. ........................................ 29/578; 29/571; 29/576 B; 29/580; 148/1.5; 148/187; 156/647; 156/648; 357/20; 357/30; 357/38; 357/55
[58] Field of Search .................. 148/1.5, 187; 29/571, 29/578, 580, 576 B; 156/647, 648; 357/20, 30, 38, 55

[56] References Cited

U.S. PATENT DOCUMENTS

| 3,697,833 | 10/1972 | Nakata | 357/38 X |
| 4,298,880 | 11/1981 | Sittig | 357/38 |
| 4,305,084 | 12/1981 | Temple | 357/20 X |

FOREIGN PATENT DOCUMENTS

| 751084 | 1/1967 | Canada | 357/30 D |
| 53-112682 | 10/1978 | Japan | 357/38 |
| 1242772 | 11/1971 | United Kingdom | 357/30 D |
| 1441261 | 6/1976 | United Kingdom | 357/30 A |

*Primary Examiner*—William G. Saba
*Attorney, Agent, or Firm*—Herbert L. Lerner; Laurence A. Greenberg

[57] ABSTRACT

Light-controlled thyristor, including a semiconductor body having a surface, a first zone being of a given conduction type and having a given depth and being adjacent to the surface of the body, a second zone of the given conduction type having a region intended for exposure, a third zone of a conduction type opposite to the given type being disposed under the first and second zones and having a part thereof emerging to the surface of the body between the first and second zones and having a depression formed therein containing the region intended for exposure, electrodes contacting the first and second zones, said second zone having a first and a second subzone, the first subzone having the given depth and being disposed between the part of the third zone emerging to the surface of the body and the depression, the first subzone being in contact with one of the electrodes, the second subzone being the region intended for exposure in the depression and being formed by implanted ions, the second subzone being disposed parallel to the surface of the body and being electrically connected to the first subzone.

5 Claims, 3 Drawing Figures

METHOD OF FABRICATING LIGHT-CONTROLLED THYRISTOR UTILIZING SELECTIVE ETCHING AND ION-IMPLANTATION

This application is a division of application Ser. No. 212,505, filed Dec. 3, 1980 now abandoned.

The invention relates to a light-controlled thyristor with a semiconductor body including a first zone of the first conduction type adjacent to the surface of the semiconductor body; a second zone of the first conduction type containing a region intended for exposure; a third zone of the second conduction type lying under the first and second zone which emerges to the surface of the semiconductor body between the first and second zone; electrodes making contact with the first and second zone; and with a depression in the third zone in which the region intended for exposure lies.

Such a light-controlled thyristor has been described, for instance, in German Published, Prosecuted application DE-AS 21 07 564. Quite generally, the problem in light-controlled thyristors is to make the dimensions of the thyristor so that it can be fired with small amounts of light power. For this purpose, the efficiency in the formation of the electron-hole pairs due to the incident light quanta must be as high as possible. For this purpose it is necessary to make the zone intended for exposure as thin as possible and locate it as close as possible to the blocking pn-junction (this is the pn-junction which cuts off when a voltage is applied in the forward direction).

In one embodiment example of the known thyristor, the zone intended for exposure is disposed for this purpose in the depression in the semiconductor body in such a manner that the pn-junction is deeper between the zone intended for exposure and the third zone therebelow that the pn-junction between the first and third zone. In addition, the zone intended for exposure is made thinner than the first zone. However, this construction of the zone intended for exposure obviously requires at least two different diffusion depths for the preparation of the first zone and for the preparation of the second zone which is intended for exposure.

It is accordingly an object of the invention to provide a light-controlled thyristor which overcomes the hereinafore-mentioned disadvantages of the heretofore-known devices of this general type, and to do so in such a manner that the manufacturing procedure can be simplified.

With the foregoing and other objects in view there is provided, in accordance with the invention, a light-controlled thyristor, comprising a semiconductor body having a surface, a first zone being of a given conduction type and having a given depth and being adjacent to the surface of the body, a second zone of the given conduction type having a region intended for exposure, a third zone of a conduction type opposite to the given type being disposed under the first and second zones and having a part thereof emerging to the surface of the body between the first and second zones and having a depression formed therein containing the region intended for exposure, electrodes contacting the first and second zones, the second zone having a first and a second subzone, the first subzone having the given depth and being disposed between the part of the third zone emerging to the surface of the body and the depression, the first subzone being in contact with one of the electrodes, the second subzone being the region intended for exposure in the depression and being formed by implanted ions, the second subzone being disposed parallel to the surface of the body and being electrically connected to the first subzone.

In accordance with another feature of the invention, the first subzone is an annular-shaped ring surrounding the second subzone.

In accordance with a further feature of the invention, there is provided a step formed in the first subzone being in alignment with the bottom of the depression and pointing toward the second subzone, the step having ions implanted therein electrically connecting the second subzone to the first subzone.

In accordance with an added feature of the invention, the first subzone has a side facing the second subzone, and there is provided a multiplicity of steps formed in the first subzone on the side thereof forming the second subzone, the steps having ions implanted therein electrically connecting the second subzone to the first subzone.

In accordance with a concomitant feature of the invention, there is provided a further zone formed of implanted ions of the opposite conduction type being disposed under and covering the second subzone, the further zone having a maximum charge carrier concentration being at least as high as the doping concentration at the surface of the third zone.

Other features which are considered as characteristic for the invention are set forth in the appended claims.

Although the invention is illustrated and described herein as embodied in a light-controlled thyristor, it is nevertheless not intended to be limited to the details shown, since various modifications and structural changes may be made therein without departing from the spirit of the invention and within the scope and range of equivalents of the claims.

Figure 2:
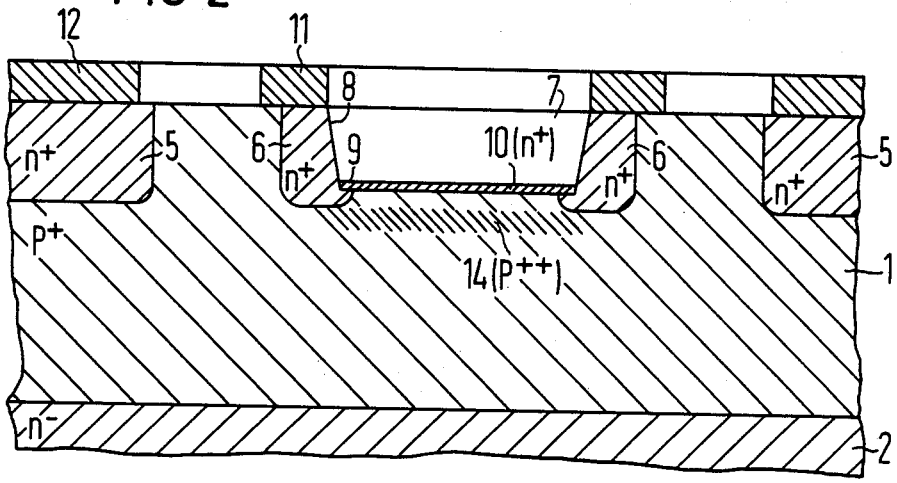
Figure 3:
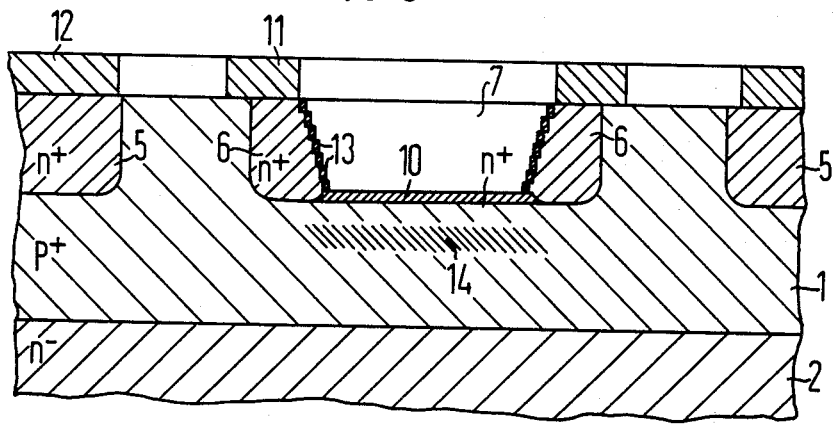

The construction and method of operation of the invention, however, together with additional objects and advantages thereof will be best understood from the following description of specific embodiments when read in connection with the accompanying drawings, in which:

FIG. 1 is a fragmentary diagrammatic cross-sectional view through a semiconductor body of a light-controlled thyristor after the first and second zones have been diffused-in; and FIGS. 2 and 3 are views which are similar to FIG. 1, showing corresponding cross sections through the semiconductor bodies of two finished light-controlled thyristors.

Referring now to the figures of the drawing and first particularly to FIG. 1 thereof, it is seen that the semiconductor body of the thyristor has several zones of different conduction types. A heavily p-doped first zone 1 which forms a base zone is diffused into a semiconductor wafer having weak n-conduction, for instance. The first zone 1 is then provided with masks 3, 4, whereupon further zones 5, 6, respectively, of the opposite conduction type are diffused into the unmasked surface portions of zone 1. The diffusion of the zones 5 and 6 takes place simultaneously. Zones 5 and 6 therefore have the same depth and the same doping. The zones 5 and 6 may, for instance, be of annular shape or strip-shaped as well.

Subsequent to the diffusion of the zones 5 and 6, a depression 7, which is shown in FIG. 2 is made into the surface of first zone 1 such as by etching, for instance.

This etching can be made so that the second zone 6 is given an inclined or vertical flank 8 on the inside thereof. The etching is broken off so early that a step 9 is left. Subsequent to the etching of the depression 7, a layer 10 that is generated by implantation of ions and which has the same conduction type and at least approximately the same doping level as the second zone 6 is prepared in the bottom of the depression 7 and on the step 9. The thickness of this layer 10 may, for instance, be 0.5 to 1 μm. The preparation of such an ion-implanted layer is known per se and will therefore not be discussed further. The layer 10 is electrically connected to the second zone 6 by the step 9. The second zone 6 is provided with an electrode 11, and the zone 5 with an electrode 12. In this way, the layer 10 which forms the region that is intended for exposure is electrically connected to the electrode 11.

A further zone highly doped 14 which is prepared by ion implantation and extends beyond layer 10 can be disposed under the layer 10. The dose and energy of this ion implantation is advantageously set so that doping is obtained for the zone 14 which is approximately equal to the doping concentration at the surface of the zone 1. This highly doped zone 14 has the purpose of shielding the zone 10 against the space charge zone forming in the zone 1.

The embodiment example according to FIG. 3 differs from that according to FIG. 2 mainly in that the second zone 6 has many small steps 13 on the inside thereof instead of a single step 9, through which the zone 10 is electrically connected to the zone 6. The steps 13 can be made in a simple manner, such as by anisotropic etching of the depression 7, for instance. In the ion implantation, ions also penetrate into the steps 13 so that the inner edge of the depression 7 becomes highly doped and allows a perfect electrical connection of the zone 10 with the electrode 11.

As in the embodiment example according to FIG. 2, the thyristor according to FIG. 3 must, however, be provided with the additional zone 14.

The operation of the thyristor corresponds to that of a known light-controlled thyristor so that special explanations regarding the action are not necessary. It is essential that the optoelectrical efficiency of the arrangement is relatively high due to the position of the layer 10 in the proximity of the space charge zone forming in the zones 1 and 2. In addition, only a single diffusion step is required for the preparation of the second and third zones 5 and 6, respectively, and only a single etching step. The same semiconductor body can also be used without the depression 7 for thyristors which can be controlled by firing current. Then, the second zone 6 is covered by the control electrode. It thus becomes inoperative.

The same sets of masks can then be used for the fabrication of light-controlled thyristors and conventional thyristors.

There are claimed:

1. Process for construction of a light-controllable thyristor having a semiconductor body of a first conductivity type, said body having an upper surface, said process comprising the steps:
   diffusing a first zone of a second conductivity type into said upper surface of said semiconductor body; masking of said first zone, said masking having unmasked areas;
   diffusing a second and a third zone of said first conductivity type into said unmasked areas; creating a depression in said upper surface of said semiconductor body in said first zone, said depression shaped such that a step is created in the bottom of said depression by material left from said second zone; creating by ion implantation a further heavily doped layer of said second conductivity type near the bottom of said depression;
   creating by means of ion implantation at the bottom of said depression in said first zone and on said step of said second zone, a layer of said first conductivity type, said layer electrically conductively connected with said first subzone of said second zone, said ion implantation creating diffusion of a doping concentration that is at least as concentrated as the doping concentration of said second zone; and
   attaching an electrode to each of said second and said third zones.

2. Process for construction of a thyristor according to claim 1, wherein said layer is created with a thickness between 0.5 and 1 micrometer.

3. Process for construction of a thyristor according to claim 2, wherein said depression is created by means of etching.

4. Process for construction of a thyristor according to claim 3, wherein said depression has vertical sides.

5. Process for construction of a thyristor according to claim 3, wherein said depression has slanted sides.

* * * * *